(12) United States Patent
Han et al.

(10) Patent No.: US 10,141,270 B2
(45) Date of Patent: Nov. 27, 2018

(54) SEMICONDUCTOR DEVICE AND METHOD OF MANUFACTURING THEREOF

(71) Applicant: Amkor Technology, Inc., Tempe, AZ (US)

(72) Inventors: Yi Seul Han, Incheon (KR); Tae Yong Lee, Goyang-si (KR); Jae Beom Shim, Incheon (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/373,713

(22) Filed: Dec. 9, 2016

(65) Prior Publication Data

US 2018/0166393 A1 Jun. 14, 2018

(51) Int. Cl.
*H01L 23/492* (2006.01)
*H01L 23/552* (2006.01)
*H01L 23/498* (2006.01)
*H01L 23/31* (2006.01)
*H01L 21/48* (2006.01)
*H01L 21/56* (2006.01)

(52) U.S. Cl.
CPC .......... *H01L 23/552* (2013.01); *H01L 21/485* (2013.01); *H01L 21/4853* (2013.01); *H01L 21/4857* (2013.01); *H01L 21/565* (2013.01); *H01L 23/3114* (2013.01); *H01L 23/49822* (2013.01); *H01L 23/49838* (2013.01); *H01L 21/568* (2013.01); *H01L 2224/04105* (2013.01); *H01L 2224/12105* (2013.01); *H01L 2224/19* (2013.01); *H01L 2224/24137* (2013.01); *H01L 2224/24195* (2013.01); *H01L 2224/96* (2013.01); *H01L 2924/3025* (2013.01); *H01L 2924/3511* (2013.01)

(58) Field of Classification Search
CPC .................... H01L 23/49822; H01L 23/49838
See application file for complete search history.

(56) References Cited

U.S. PATENT DOCUMENTS

| | | | |
|---|---|---|---|
| 8,420,437 B1* | 4/2013 | Fan ........................ | H01L 23/552 257/419 |
| 9,693,458 B2* | 6/2017 | Yoshikawa .......... | H05K 3/4007 |
| 2004/0070948 A1* | 4/2004 | Kao ..................... | H01L 23/3128 361/717 |
| 2016/0336249 A1* | 11/2016 | Kang ................... | H01L 23/3128 |
| 2017/0032977 A1* | 2/2017 | Chen .................... | H01L 21/4857 |

FOREIGN PATENT DOCUMENTS

KR 20130140354 A * 12/2013 ............. H01L 24/32

* cited by examiner

*Primary Examiner* — Michele Fan
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a semiconductor device comprising a semiconductor die coupled to a substrate and surrounded by a perforated metal plane and a method of manufacturing thereof.

20 Claims, 8 Drawing Sheets

SEMICONDUCTOR DEVICE AND METHOD OF MANUFACTURING THEREOF

BACKGROUND

Present semiconductor devices and methods for manufacturing semiconductor devices are inadequate, for example resulting in noise sensitivity that is too high, semiconductor packages lacking the proper support, excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
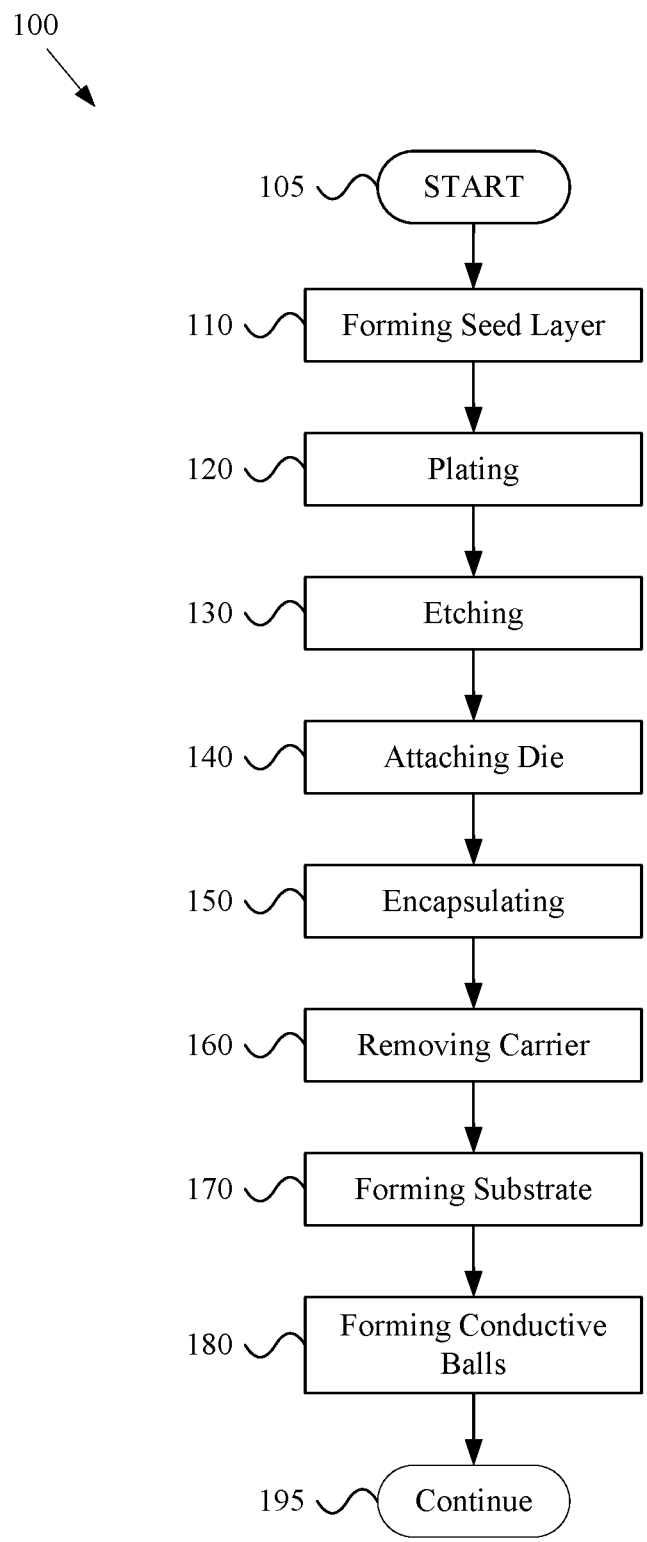
FIG. 1 shows a flow diagram of an example method of manufacturing a semiconductor device, in accordance with various aspects of the present disclosure.

Various aspects of this disclosure provide a semiconductor device and a method of manufacturing a semiconductor device. As a non-limiting example, various aspects of this disclosure provide a semiconductor device comprising a semiconductor die coupled to a substrate and surrounded by a perforated metal plane and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Various aspects of the present disclosure provide a method of manufacturing a semiconductor device, and a semiconductor device manufactured thereby.

For example, various aspects of the present disclosure provide a method of manufacturing a semiconductor device, and a semiconductor device manufactured thereby, wherein the semiconductor device comprises: a substrate having a top substrate surface, a bottom substrate surface, and lateral substrate surfaces extending between the top and bottom substrate surfaces; a metal plane on the top substrate surface, the metal plane comprising first and second apertures extending completely through the metal plane; a semiconductor die on the top substrate surface and positioned within the first aperture of the metal plane, the semiconductor die having a top die surface, a bottom die surface, and lateral die side surfaces extending between the top and bottom die surfaces, wherein the bottom die surface is coupled to the top substrate surface; and an encapsulating material that encapsulates at least a portion of the lateral die side surfaces and at least a portion of the top substrate surface, wherein the encapsulating material extends through the second aperture of the metal plane.

Also for example, various aspects of the present disclosure provide a method of manufacturing a semiconductor device, and a semiconductor device manufactured thereby, wherein the semiconductor device comprises: a substrate having a top substrate surface, a bottom substrate surface, and lateral substrate surfaces extending between the top and bottom substrate surfaces; a metal layer on the top substrate surface, the metal layer comprising a first section comprising first and second apertures extending completely through the first section, and a second section electrically isolated from the first section and comprising a third aperture extending completely through the second section; a semiconductor die on the top substrate surface and positioned within the first aperture of the first section, the semiconductor die having a top die surface, a bottom die surface, and lateral die side surfaces extending between the top and bottom die surfaces, wherein the bottom die surface is coupled to the top substrate surface; and an encapsulating material that encapsulates at least a portion of the lateral die side surfaces and at least a portion of the top substrate surface, wherein the encapsulating material fills the second aperture of the first section and the second aperture of the second section.

Additionally for example, various aspects of the present disclosure provide a method of manufacturing a semiconductor device, and a semiconductor device manufactured thereby, wherein the semiconductor device comprises: a substrate having a top substrate surface, a bottom substrate surface, and lateral substrate surfaces extending between the top and bottom substrate surfaces; a metal layer on the top substrate surface, the metal layer comprising first and second apertures extending completely through the metal layer; a semiconductor die on the top substrate surface and positioned within the first aperture of the metal layer, the semiconductor die having a top die surface, a bottom die surface, and lateral die side surfaces extending between the top and bottom die surfaces, wherein the bottom die surface is coupled to the top substrate surface; and an encapsulating material that encapsulates at least a portion of the lateral die side surfaces and at least a portion of the top substrate surface, wherein the encapsulating material extends into the second aperture of the metal layer, wherein a metal surface exposed at a top surface of the encapsulating material and electrically connected to the metal layer.

Various aspects of the present disclosure will now be described in detail with reference to the accompanying drawings such that they may be readily practiced by those skilled in the art.

FIG. 1 shows a flow diagram of an example method 100 of manufacturing a semiconductor device, in accordance with various aspects of the present disclosure. The example method 100 may, for example, comprise forming a seed layer (110), plating (120), etching (130), die attaching (140), encapsulating (150), carrier removing (160), substrate forming (170), conductive ball forming (180), etc.

FIGS. 2A-2H show cross-sectional views of an example semiconductor device during manufacturing in accordance with the example method 100 of FIG. 1. The following discussion will generally refer to FIG. 1 and FIGS. 2A-2H together.

The example method 100 may begin executing at block 105. The example method 100 may begin executing in response to any of a variety of conditions, non-limiting examples of which are provided herein. For example, the example method 100 may begin execution by receiving execution flow from any of the blocks 110-195 of the example method 100 or any portion of such blocks 110-195.

The example method 100 may, at block 110, comprise forming a seed layer on a carrier. A non-limiting example of such forming is presented at FIG. 2A. The carrier 10 may comprise any of a variety of characteristics. For example, the carrier 10 may comprise any of a variety of carrier materials (e.g., glass, metal, silicon and/or other semiconductor material, plastic, polymer, etc.). The carrier 10 may comprise any of a variety of shapes or form-factors (e.g., square or rectangular panel shaped, wafer shaped and/or sized, shaped and/or sized to match or carry a single semiconductor device in process, etc.).

Block 110 may, for example, comprise forming the seed layer 11 on a top surface (or side) of the carrier 10. The seed layer 11 may comprise any of a variety of materials. For example, the seed layer 11 may comprise copper. Also for example, the seed layer 11 may comprise one or more layers of any of a variety of metals (e.g., copper, silver, gold, aluminum, tungsten, titanium, nickel, molybdenum, etc.).

Block 110 may comprise forming the seed layer 11 in any of a variety of manners. For example, block 110 may comprise forming the seed layer 11 utilizing sputtering or other physical vapor deposition (PVD) technique, chemical vapor deposition (CVD), electroless plating, electrolytic plating, etc.). The seed layer 11 may, for example, be utilized during a subsequent electroplating process, for example plating a same or different metal than that of the seed layer 11.

In general, block 110 may comprise forming a seed layer. Accordingly, the scope of this disclosure should not be limited by characteristics of any particular type of seed layer and/or by any particular manner of forming a seed layer.

Figure 2A:
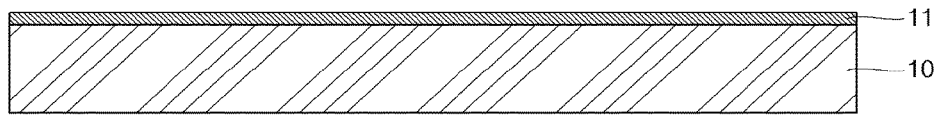
FIGS. 2A-2H show cross-sectional views of an example semiconductor device during manufacturing in accordance with the example method of FIG. 1.
Figure 2B:
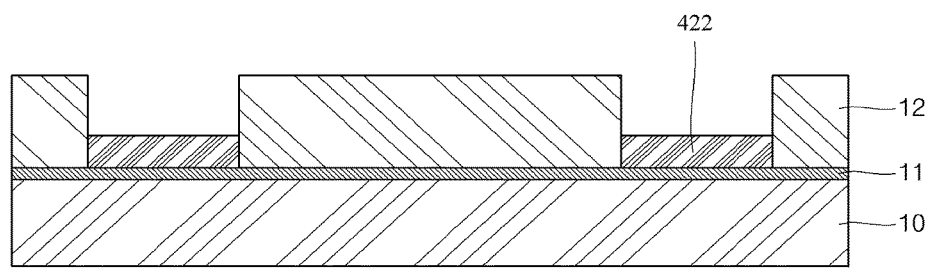

The example method 100 may, at block 120, comprise forming a plated metal layer on the seed layer. A non-limiting example of such forming is shown at FIG. 2B.

Block 120 may comprise forming the plated metal layer in any of a variety of manners. For example, block 120 may comprise forming a mask layer 12 (or template) over the seed layer 11 to define a region (or volume) in which a plated metal layer is to be formed. For example, the mask layer 12 may comprise a photoresist (PR) material or other material (e.g., any dielectric material, etc.), which may be patterned to cover regions of the seed layer 11 other than regions on which the plated metal layer is to be formed. Block 120 may comprise forming the mask layer 12 in any of a variety of manners (e.g., printing the patterned layer, forming a uniform layer followed by hardening first portions and removing second portions, etc.).

Block 120 may then, for example, comprise forming (e.g., electroplating) a plated metal layer 422 on the portions of the seed layer 11 exposed through the mask layer 12. As discussed herein, the plated metal layer 422 may comprise any of a variety of materials (e.g., copper, titanium, chromium, aluminum, gold, silver, titanium/tungsten, titanium/nickel, alloys thereof, etc.). Block 120 may comprise forming the plated metal layer 422 on the seed layer 11 by electroplating the metal layer 422 on the portions of the seed layer 11 exposed through openings in the mask layer 12.

After forming the plated metal layer 422, block 120 may comprise removing the mask layer 12 (e.g., by ashing, chemical stripping, mechanical removal, etc.). Such removal of the mask layer 12 may, for example, expose the previously-covered portion of the seed layer 11 for further processing, for example as performed at block 130.

In general block 120 may comprise forming (or plating) a plated metal layer. Accordingly, the scope of this disclosure should not be limited by characteristics of any particular manner of forming (or plating) a metal layer.

Figure 2C:
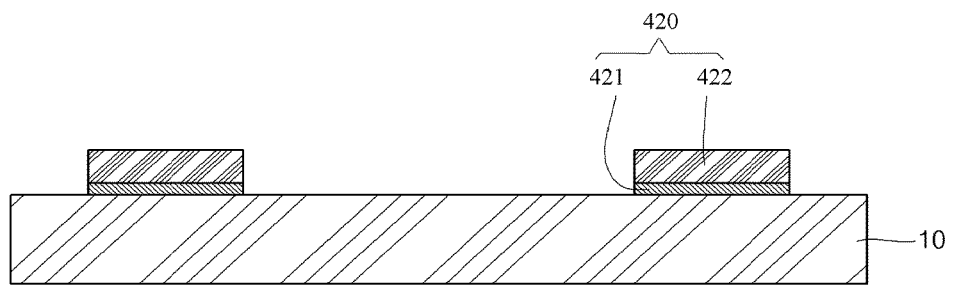

The example method 100 may, at block 130, comprise etching the seed layer. A non-limiting example of such etching is shown at FIG. 2C.

Block 130 may comprise performing such etching in any of a variety of manners. For example, block 130 may comprise removing the portion of the seed layer 11 (e.g., by chemically etching, etc.) that is not covered by the plated metal layer 422. Note that during the etching of the seed layer 11, a top surface portion of and/or a lateral edge portion of the plated metal layer 422 and a lateral edge portion of the seed layer 11 under the plated metal layer 422 may be etched.

The remaining portion of the seed layer 11 after etching will be referred to herein as the seed layer 421. The combined seed layer 421 and plated metal layer 422 will be referred to herein as the metal plane 420 (or metal plate 420 or metal layer 420). The metal plane 420 may, for example, be generally planar-shaped, but the scope of this disclosure is not limited thereto. In an example implementation, the metal plane 420 covers at least half of the carrier 10 (and ultimately the substrate 410). In another example implementation, the metal plane 420 covers at least one fourth of the carrier 10 (and ultimately the substrate 410).

Figure 3A:
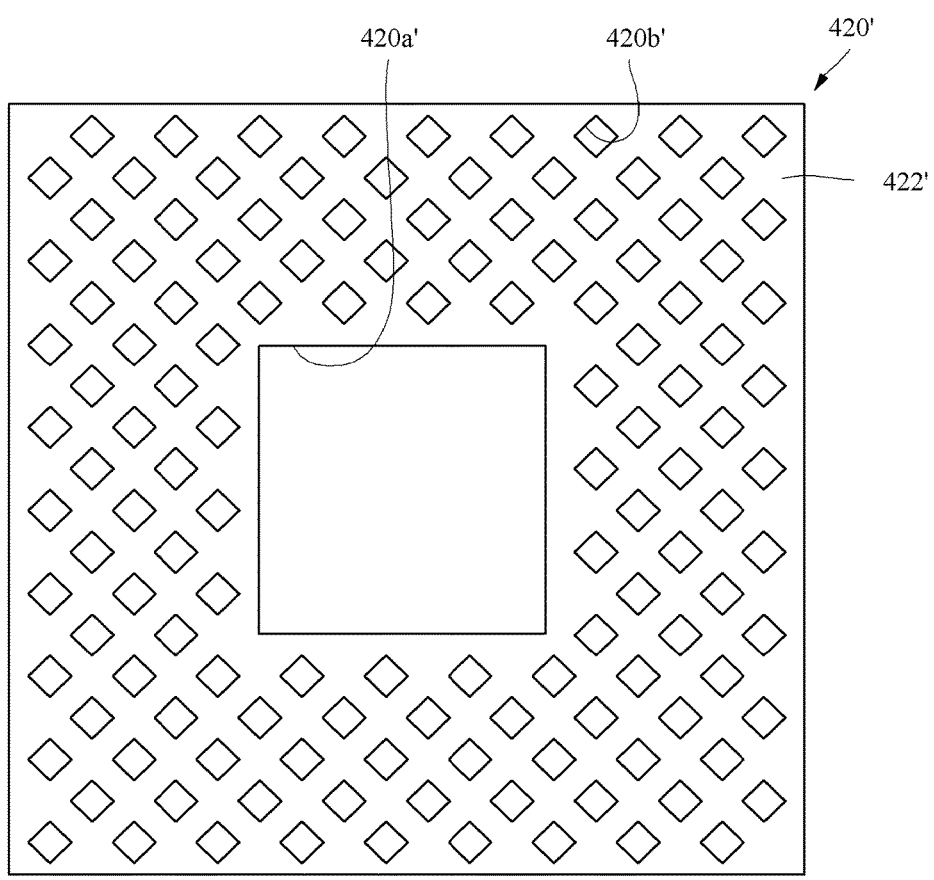
FIGS. 3A-3B show plan views of example metal planes, in accordance with various aspects of the present disclosure.
Figure 3B:
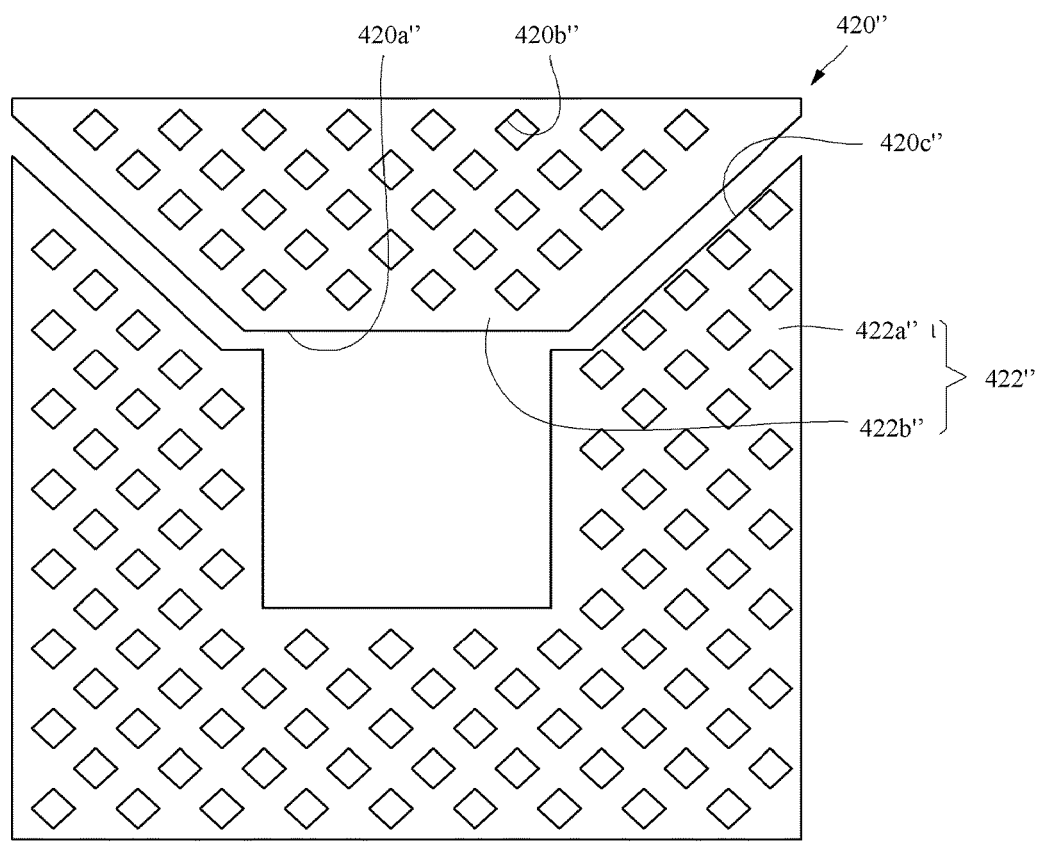

Examples of the formed metal plane 420 and features thereof are shown at FIGS. 3A and 3B. In particular, FIGS. 3A and 3B show plan views of example metal planes, namely 420' and 420", in accordance with various aspects of the present disclosure.

Referring to FIG. 3A, the example metal plane 420' shows the plated metal layer 422' at the top side of the metal plane 420'. Note that in the plan view of FIG. 3A, the plated metal layer 422' is covering the seed layer 421', which is not shown. The example metal plane 420' may, for example, be generally planar with openings extending therethrough. The example metal plane 420' may, for example, share any or all characteristics with the example metal plane 420" of FIG. 3B, the example metal plane 420 of FIGS. 2C-2H and 4-7, etc.

The example metal plane 420' (e.g., the plated metal layer 422', the seed layer 421' (not shown), etc.) comprises a first one or more apertures 420a' (or openings or through holes) extending through the metal plane 420'. The first one or more apertures 420a' may, for example, provide an opening in the metal plane 420' in which one or more electronic components (e.g., semiconductor die, passive components, etc.) may be positioned (e.g., at block 140). Though only one of the first one or more apertures 420a' is shown in FIG. 3A, any number of such apertures may be present. In an example implementation, a plurality of such apertures 420a' may be present, and one or more respective electronic components (e.g., semiconductor dies, passive components, etc.) may be positioned in each of such apertures 420a'.

The example metal plane 420' (e.g., the plated metal 422', the seed layer 421' (not shown), etc.) also comprises a second one or more apertures 420b' (or openings or through holes) extending through the metal plane 420'. The second one or more apertures 420b' may, for example, provide an opening in the metal plane 420' in which encapsulating material may be positioned (e.g., at block 150).

As shown by example in FIG. 3A, the first one or more apertures 420a' may be positioned in a central portion of the metal plane 420' and may be laterally surrounded by the second one or more apertures 420b'. Note that the positions of such apertures, however, are not so limited. For example, the first one or more apertures 420a' may be positioned in a manner that is skewed toward a first lateral side of the metal plane 420a'.

Also note that while the shapes of the example first one or more apertures 420a' and the example second one or more apertures 420b' are generally shown as square, any of a variety of shapes may be utilized. For example, such apertures 420a' and 420b' may be rectangular, rhombus-shaped, circular, triangular, cross-shaped, X-shaped, elliptical shaped, polygonal, etc. Also for example, the first one or more apertures 420a' (or a portion thereof) may be shaped differently than the second one or more apertures 420b' (or a portion thereof). Also for example, such apertures 420a' and/or 420b' may be oriented in different directions (e.g., alternating, radially, etc.). For example, some of the first one or more apertures 420a' may be oriented differently than others of the first one or more apertures 420a', some of the second one or more apertures 420b' may be oriented differently than others of the second one or more apertures 420b', and/or some of the first one or more apertures 420a' may be oriented differently than some of the second one or more apertures 420b'.

Referring to FIG. 3B, the example metal plane 420" shows the plated metal layer 422" at the top side of the metal plane 420". Note that in the plan view of FIG. 3B, the plated metal layer 422" is covering the seed layer 421", which is not shown. The example metal plane 420" may, for example, be generally planar with openings extending therethrough. The example metal plane 420" may, for example, share any or all characteristics with the example metal plane 420' of FIG. 3A, the example metal plane 420 of FIGS. 2C-2H and 4-7, etc.

The example metal plane 420" (e.g., the plated metal layer 422", the seed layer 421" (not shown), etc.) comprises a first one or more apertures 420a" (or openings or through holes) extending through the metal plane 420". The first one or more apertures 420a" may, for example, provide an opening in the metal plane 420" in which one or more electronic components (e.g., semiconductor die, passive components, etc.) may be positioned (e.g., at block 140). Though only one of the first one or more apertures 420a" is shown in FIG. 3B, any number of such apertures may be present. In an example implementation, a plurality of such apertures 420a" may be present, and one or more respective electronic components (e.g., semiconductor dies, passive components, etc.) may be positioned in each of such apertures 420a".

The example metal plane 420" (e.g., the plated metal 422", the seed layer 421" (not shown), etc.) also comprises a second one or more apertures 420b" (or openings or through holes) extending through the metal plane 420". The second one or more apertures 420b" may, for example, provide an opening in the metal plane 420" in which encapsulating material may be positioned (e.g., at block 150).

As shown by example in FIG. 3B, the first one or more apertures 420a" may be positioned in a central portion of the metal plane 420" and may be laterally surrounded by the second one or more apertures 420b". Note that the positions of such apertures, however, are not so limited. For example, the first one or more apertures 420a" may be positioned in a manner that is skewed toward a first lateral side of the metal plane 420a".

Also note that while the shapes of the example first one or more apertures 420a" and the example second one or more apertures 420b" are generally shown as square, any of a variety of shapes may be utilized. For example, such apertures 420a" and 420b" may be rectangular, rhombus-shaped, circular, triangular, cross-shaped, X-shaped, elliptical shaped, polygonal, etc. Also for example, the first one or more apertures 420a" (or a portion thereof) may be shaped differently than the second one or more apertures 420b" (or a portion thereof). Also for example, such apertures 420a" and/or 420b" may be oriented in different directions (e.g., alternating, radially, etc.). For example, some of the first one or more apertures 420a" may be oriented differently than others of the first one or more apertures 420a", some of the second one or more apertures 420b" may be oriented differently than others of the second one or more apertures 420b", and/or some of the first one or more apertures 420a" may be oriented differently than some of the second one or more apertures 420b".

The example metal plane 420" is separated (or divided) into a plurality (e.g., two, three, etc.) of electrically isolated sections. The example metal plane 420" (and thus the example plated metal layer 422" and seed layer 421", not shown) is separated into a first metal layer section, including a first plated metal layer section 422a" (and a first seed layer section 421a" thereunder, not shown) and a second metal layer section, including a second plated metal layer section 422b" (and a second seed layer section 421b" thereunder, not shown). The first metal layer section (including the first plated metal layer section 422a" and first seed layer section 421a" thereof) and the second metal layer section (including the second plated metal layer section 422b" and second seed layer section 421b" thereof) may, for example, be separated by a cutout region 420c", which provides for electrical isolation between the sections. Note that although the first one or more apertures 420a" of FIG. 3B are shown in the first plated metal layer section 422a", the first one or more apertures 420a" may be formed in any or all of the plated metal layer sections.

The different sections of the metal plane 420" may, for example, provide for different respective electrical signals to be applied to each metal layer section. For example, a non-ground power signal may be applied to a first of the metal layer sections, and a ground signal may be applied to a second of the metal layer sections. In another example implementations, a first power signal may be applied to a first of the metal layer sections, a second power signal may be applied to a second of the metal layer sections, a third power signal may be applied to a third of the metal layer sections, etc.

Though the example metal plane 420 (including for example, the metal plane 420' and/or metal plane 420") is formed at blocks 110-130 utilizing an electroplating process, any of a variety of processes may be utilized. For example, the example metal plane 420 may be formed utilizing electroplating, electroless plating, sputtering, CVD, PVD, ALD, etc. Thus, in various example implementations, the metal plane 420 might comprise only one metal layer, two metal layers, three metals, or N metal layers (N being an integer). For example, the seed layer 421 may or may not be present.

In general, block 130 may comprise etching the seed layer. Accordingly, the scope of the present disclosure should not be limited by characteristics of any particular manner of seed layer etching (or removal).

Figure 2D:
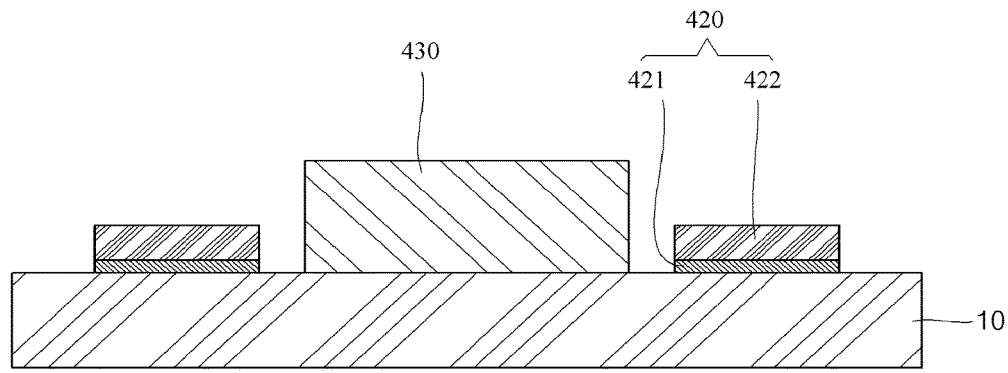

The example method 100 may, at block 140, comprise attaching a semiconductor die to the carrier. A non-limiting example of such attaching is shown at FIG. 2D.

Block 140 may comprise attaching (or mounting or coupling) the semiconductor die 430 to the carrier 10 in any of a variety of manners, non-limiting examples of which are provided herein. Block 140 may, for example, comprise adhering the semiconductor die 430 (or any one or more electronic components, active component(s), passive component(s), etc.) to the carrier 10 using a die attach adhesive or other adhesive, vacuum force, etc.

An active surface (or side) of the semiconductor die 430 may, for example, be attached to a top surface (or side) of the carrier 10 (e.g., to a same side of the carrier 10 on which the metal plane 420 was formed at blocks 110-130). For example, one or more bond pads (or contacts or interconnection structures, for example conductive pillars, conductive bumps, etc.) on the active side of the semiconductor die 430 and/or an active side passivation layer may be adhered to the carrier 10. Note that such active side orientation is not required for all implementations. Also for example, one or more bond pads (or contacts or interconnection structures) of one or more passive electronic components may be adhered to the carrier 10.

As discussed herein, the semiconductor die 430 and/or other electronic components may be positioned in a first one or more respective apertures 420a (e.g., 420a', 420a", etc.) in the metal plane 420 (e.g., 420', 420", etc.). As shown in FIG. 2D, the semiconductor die 430 (e.g., a lower portion thereof, the entirety thereof, etc.) may be laterally surrounded by the metal plane 420.

As discussed herein, a plurality of electronic components may be positioned in a same aperture of the metal plane 420 and/or a plurality of electronic components may be positioned in different respective apertures of the metal plane 420.

Though the examples presented herein generally concern the attaching of one or more semiconductor die, any one or more of a variety of electronic components (e.g., instead of or in addition to the semiconductor die) may be attached. The one or more electronic component(s) may, for example, comprise a semiconductor die. Such semiconductor die may, for example, comprise a processor die, microprocessor, microcontroller, co-processor, general purpose processor, application-specific integrated circuit, programmable and/or discrete logic device, memory device, combination thereof, equivalent thereof, etc. The one or more electronic components may also, for example, comprise one or more passive electronic devices (e.g., resistors, capacitors, inductors, etc.).

In general, block 140 may comprise attaching a semiconductor die (and/or other electronic components) to the carrier. Accordingly, the scope of various aspects of this disclosure should not be limited by characteristics of any particular type of electronic component, any particular manner of attaching (or positioning or mounting or coupling) an electronic component, any particular positioning of an electronic component, etc.

Figure 2E:
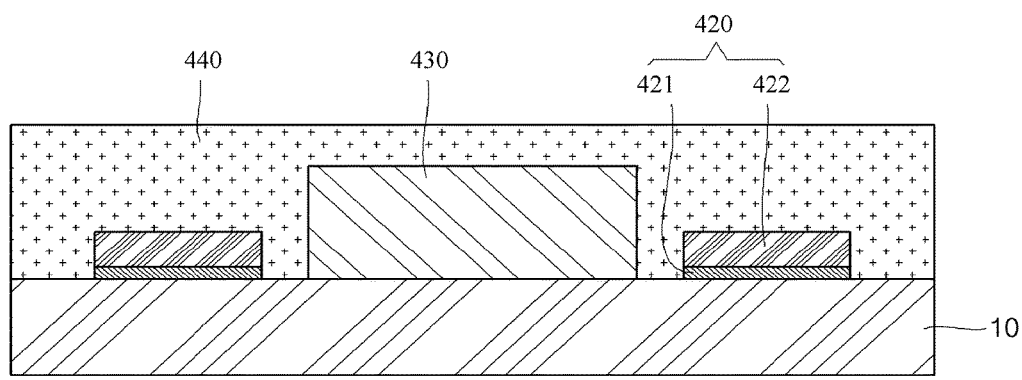

The example method 100 may, at block 150, comprise performing encapsulating. An example of such encapsulating is shown at FIG. 2E.

Block 150 may, for example, comprise covering top and/or lateral sides of the semiconductor die 430 (and/or other electronic components), covering top and/or lateral sides of the metal plane 420, covering a top side of the carrier 10, etc., with an encapsulating material 440.

Note that any or all of such components (e.g., top sides thereof, upper lateral sides thereof, etc.) may be exposed from the encapsulating material 440. Such exposure may, for example, be performed at the initial encapsulating (e.g., by leaving such surfaces uncovered by the encapsulating material 440 during the initial forming of the encapsulating material 440). Also for example, such exposure may be performed by thinning (e.g., grinding, etching, planarizing, etc.) encapsulating material 440 that was originally formed to cover surfaces, which are then exposed after the thinning. Note that such thinning may also comprise thinning one or more of the electronic components. Additionally for example, block 150 may comprise thinning the encapsulating material 440 but not enough to expose one or more or all of the electronic components.

Block 150 may, for example, comprise filling the apertures of the metal plane 420 that are not filled with electronic components (e.g., the semiconductor die, etc.) with the encapsulating material 440. For example, as discussed herein, the metal plane 420 may comprise a first one or more apertures 420a in which electronic components are positioned (e.g., at block 140, etc.). Block 150 may comprise filling the portion(s) of such aperture(s) that are not filled with the electronic component(s) with encapsulating material 440. Also for example, as discussed herein, the metal plane 420 may comprise a second one or more apertures 420b (e.g., in which no electronic components are positioned). Block 150 may comprise filling any or all of such apertures with the encapsulating material 440. Such filling may, for example, enhance the coupling between the encapsulating material 440 and a substrate and may also reduce warpage in the semiconductor device.

The encapsulating material 440 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). Block 150 may comprise forming the encapsulating material 440 in any of a variety of manners (e.g., compression molding, transfer molding, liquid encapsulant molding, vacuum lamination, paste printing, film assisted molding, etc.).

In general, block 150 may comprise performing encapsulating. Accordingly, the scope of the present disclosure should not be limited by characteristics of any particular manner of encapsulating, by characteristics of any particular type of encapsulating material, etc.

The example method 100 may, at block 160, comprise removing the carrier. An example of such carrier removing is shown at FIG. 2F (e.g., relative to FIG. 2E in which the carrier 10 is shown).

Block 160 may, for example, comprise removing the carrier 10 by performing one or more of mechanical grinding, chemical etching, chemical-mechanical planarization (CMP), etc. Also for example, block 160 may comprise sliding, shearing, and/or peeling the carrier 10. In an example implementation in which the carrier 10 is coupled to the metal plane 420 utilizing an adhesive (e.g., a thermally releasable adhesive, a UV releasable adhesive, etc.), block 160 may comprise breaking (or weakening) the adhesive bond of such adhesive (e.g., by applying heat, light, chemical(s), etc.) prior to removal of the carrier 10.

In various implementations, block 160 may for example comprise preparing the carrier 10 for future re-use. For example, block 160 may comprise cleaning or stripping adhesive residue from the carrier, applying an adhesive to the carrier 10 for a next use, etc.

Figure 2F:
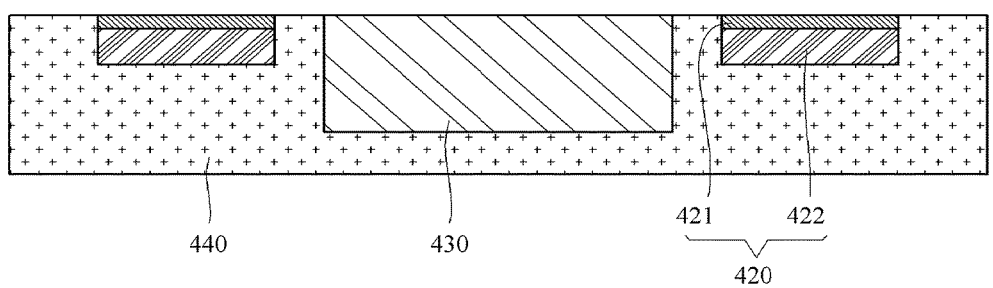

As shown in FIG. 2F, the assembly may be re-oriented at this point for processing on the side of the assembly previously shown facing toward the bottom (e.g., facing toward the carrier 10) in FIG. 2E. As shown in FIG. 2F at a top side of the assembly, surfaces of the metal layer 440 (e.g., the seed layer 421 if present, the plated layer 422, etc.), a surface of the semiconductor die 430 (e.g., an active side of the semiconductor die 430, a passivation layer of the semiconductor die 430, and/or bond pads exposed through respective apertures in such a passivation layer, etc.), and a surface of the encapsulating material 440 may be coplanar. Note that although not shown in FIG. 2F, the bottom side of the assembly may be coupled to another carrier or holder (e.g., before or after removal of the carrier 10).

In general, block 160 may comprise removing the carrier. Accordingly, the scope of this disclosure should not be limited by characteristics of any particular manner of removing a carrier, by characteristics of any particular type of carrier, etc.

Figure 2G:
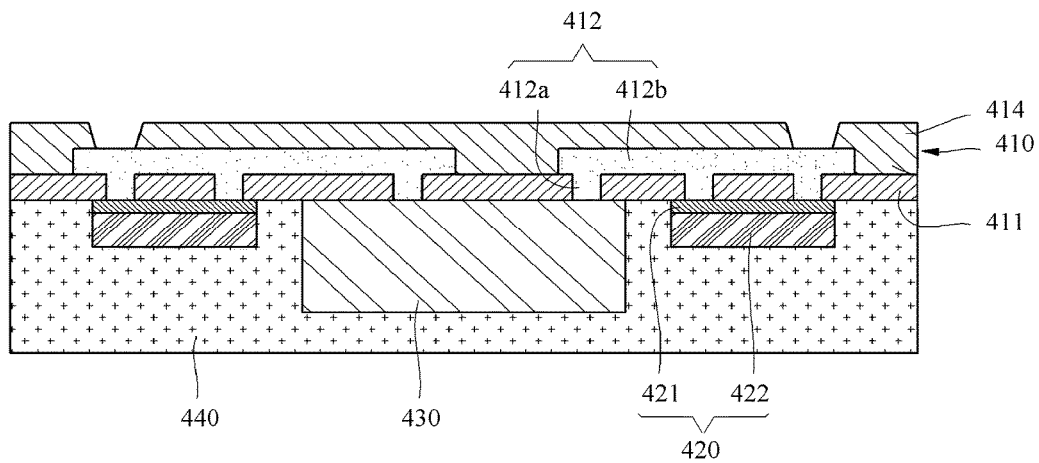

The example method 100 may, at block 170, comprise forming a substrate. An example of such substrate forming is shown at FIG. 2G.

Block 170 may, for example, comprise attaching a pre-formed substrate (or pre-formed portion of a substrate). For example, prior to such attachment, the substrate (or a portion thereof) may have been formed utilizing any of a variety of techniques. Additionally, block 170 may comprise forming (or building up) the substrate in place of the carrier removed at block 160. Non-limiting examples of substrate forming and/or attachment are provided in U.S. patent application Ser. No. 14/823,689, filed on Aug. 11, 2015, titled "Semiconductor Package and Fabricating Method Thereof," which is hereby incorporated herein by reference in its entirety for all purposes.

In an example implementation, block 170 may comprise forming the substrate on the side of the assembly that was covered by the carrier 10 prior to removal of the carrier 10 at block 160. Block 170 may comprise forming the substrate in any of a variety of manners, non-limiting examples of which are provided herein. Note that the substrate may also be referred to as an interposer, a signal distribution structure, a signal redistribution structure, etc.

Block 170 may, for example, comprise forming a first dielectric layer 411. The dielectric layer 411 may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block 170 may comprise forming the first dielectric layer 411 using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition, sheet lamination, evaporating, etc.), but the scope of the present disclosure is not limited thereto.

Block 170 may, for example, comprise forming apertures (or openings or holes) through the first dielectric layer 411. Such apertures may, for example, provide openings in the first dielectric layer 411 in which conductive material may be formed. For example, such apertures may expose bond pads (or generally interconnection structures, such as conductive pillars, conductive bumps, etc.) of the semiconductor die 430 (and/or other components) through the first dielectric layer 411. For example, such apertures may expose end surfaces of such bond pads or general interconnection structures, the entirety of such bond pads or general interconnection structures extending from the semiconductor die 430, or any portion thereof. Also for example, such apertures may expose the metal plane 420 through the first dielectric layer 411. Such aperture forming may, for example, be performed after the first dielectric layer 411 is initially formed (e.g., by laser ablation, mechanical ablation, chemical etching, etc.). Also for example, such apertures may be formed during the original deposition of the first dielectric layer 411 (e.g., by selective printing, masking and depositing, etc.). Note that the apertures may, for example, be generally cylindrical, may have sloped sidewalls with a first end opening larger than a second end opening (e.g., shaped like a truncated cone), may have a rectangular box shape, may have a shape like a truncated pyramid, etc.

Block 170 may also, for example, comprise forming one or more conductive layers 412 on and/or through the first dielectric layer 411. For example, block 170 may comprise forming a first conductive layer portion 412a (or layer) in the apertures in the first dielectric layer 411, and a second conductive layer portion 412b (or layer) on the first dielectric layer 411 (e.g., generally running parallel to the surface of the dielectric layer 411 on which the conductive layer portion 412b is formed). For example, in an example implementation, the one or more conductive layers 412 may electrically connect one or more bond pads (or general interconnection structure, for example conductive pillars, conductive pads, etc.) of the semiconductor die 430 and the metal plane 420 (or a section thereof).

In an example implementation in which the metal plane 420 comprises multiple electrically isolated sections (an example 420" of which is provided at FIG. 3B and discussed herein), a first part of the conductive layer(s) 412 may electrically connect a first bond pad or general interconnection structure of the semiconductor die 430 to a first metal layer section, and a second part of the conductive layer(s) 412 may electrically connect a second bond pad or general interconnection structure of the semiconductor die 430 to a second metal layer section.

The conductive layer(s) 412 may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block 170 may comprise forming the conductive layer(s) utilizing any one or more of a variety of processes (e.g., electrolytic plating, electroless plating, chemical vapor deposition (CVD), sputtering or physical vapor deposition (PVD), atomic layer deposition (ALD), plasma vapor deposition, printing, screen printing, lithography, solder mounting or deposition, metal blocking, etc.), but the scope of the present disclosure is not limited thereto.

Block 170 may, for example, comprise forming a second dielectric layer 414 on the first dielectric layer 411 and/or on the one or more conductive layers 412. Block 170 may, for example, comprise forming the second dielectric layer 414 in a same manner as the first dielectric layer 411, or in a different manner.

The second dielectric layer 414 may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. For example, the second dielectric layer 414 may be formed of a same material as the first dielectric layer 411 or may be formed of a different material. In an example scenario, the first dielectric layer 411 may be formed of an inorganic dielectric material, and the second dielectric layer 414 may be formed of an organic dielectric material.

Block 170 may comprise forming the second dielectric layer 414 using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto. The second dielectric layer 414 may be formed utilizing a same process as the first dielectric layer 411, but may also be formed utilizing a different process (e.g., when utilizing different respective dielectric materials, when forming apertures or conductors having different respective pitches, etc.).

Block 170 may, for example, comprise forming apertures (or openings or holes) through the second dielectric layer 414. Such apertures may, for example, provide openings in the second dielectric layer 414 in which conductive material may be formed, in which under bump metallization may be formed, etc. For example, such apertures may expose the conductive layer (or lands thereof) through the second dielectric layer 414.

Such aperture forming may, for example, be performed after the second dielectric layer 414 is initially formed (e.g., by laser ablation, mechanical ablation, chemical etching, etc.). Also for example, such apertures may be formed during the original deposition of the second dielectric layer 414 (e.g., by selective printing, masking and depositing, etc.). Note that the apertures may, for example, be generally cylindrical, may have sloped sidewalls with a first end opening larger than a second end opening (e.g., shaped like a truncated cone), may have a rectangular box shape, may have a shape like a truncated pyramid, etc.

As mentioned herein, in an example implementation, block 170 may comprise forming under bump metallization (one or more metal layers) in the apertures in the second dielectric layer 414 and/or on perimeter regions of the second dielectric layer 414 surrounding such apertures. Such under bump metallization ("UBM") or UBM structure may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation, forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure and/or processes utilized to form the UBM structure are not limited to the examples given. For example, the UBM structure may comprise a multilayered structure of chrome/chrome-copper alloy/copper (Cr/Cr—Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

Note that in various example implementations, the carrier 10 may have the substrate formed thereon prior to forming (or attaching) the metal plane 420 and/or the semiconductor die 430 thereon. For example, at block 110-130, the metal plane 420 may be formed on (e.g., built on, attached to, etc.) such a substrate. Also for example, at block 140, the semiconductor die 140 may be attached to such a substrate (e.g., electrically and/or mechanically attached). In such example implementations, a temporary portion of the carrier may be removed at block 160 (e.g., by grinding, peeling, etc.). Also, in others of such example implementations, no portion of the carrier is removed (e.g., skipping block 160).

Note that although the example substrate 410 shown herein includes a first dielectric layer 411, a conductive layer 412, and a second dielectric layer 414, the substrate 410 may include any number of such layers.

In general, block 170 may comprise forming a substrate. Accordingly, the scope of the present disclosure should not be limited by characteristics of any particular substrate or of any particular manner of forming a substrate.

Figure 2H:
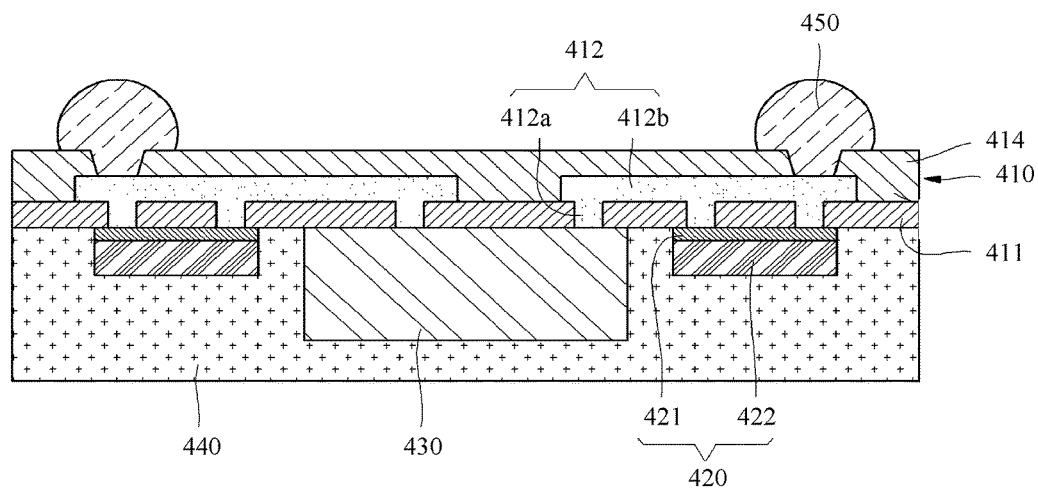

The example method 100 may, at block 180, comprise forming interconnection structures (e.g., conductive balls, etc.). An example of such forming is shown at FIG. 2H.

The interconnection structures 450 may comprise any of a variety of characteristics. For example, an interconnection structure 450 may comprise a conductive ball or bump (e.g., a solder ball or bump, wafer bump, etc.). For example, in an example implementation including a solder ball or bump, such balls or bumps may comprise tin, silver, lead, Sn—Pb, Sn$_{37}$—Pb, Sn$_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto.

Block 180 may comprise forming the interconnection structures 450 (e.g., conductive balls, etc.) in any of a variety of manners, non-limiting examples of which are provided herein. Block 180 may comprise forming or attaching such interconnection structures 450 by ball-dropping, bumping, metal-plating, pasting and reflowing, etc. For example, block 180 may comprise dropping (or forming) a conductive ball 450 on the UBM (or conductive pad or exposed portion of the conductive layer 412), reflowing, and cooling. As discussed herein, the interconnection structure 450 may be formed on a UBM. Though not explicitly shown in FIG. 2H, the conductive balls 450 may each be formed to cover a respective UBM formed on the conductive layer 412 exposed through a respective aperture in the second dielectric layer 414, on side walls of the respective aperture, and on a top surface of the second dielectric layer 414 around a perimeter of the respective aperture.

In general, block 180 may comprise forming one or more interconnection structures. Accordingly, the scope of this disclosure should not be limited by characteristics of any particular type of interconnection structure or by characteristics of any particular manner of forming an interconnection structure.

The example method 100 may, at block 195, comprise preforming additional processing on the semiconductor device. Such additional processing may comprise any of a variety of characteristics, non-limiting examples of which are provided herein.

For example, block 195 may comprise directing execution flow back to any prior block (or portion thereof) of the example method 100. Also for example, block 195 may comprise performing a singulation operation, for example in an implementation in which the carrier or substrate is in a wafer or panel form. Additionally for example, block 195 may comprise performing testing, marking, packaging, shipping, etc. Further for example, as shown herein with regard to FIG. 7, block 195 may comprise forming a shield layer.

In general, block 195 may comprise performing additional processing. Accordingly, the scope of this disclosure should not be limited by characteristics of any particular type of additional processing.

Figure 4:
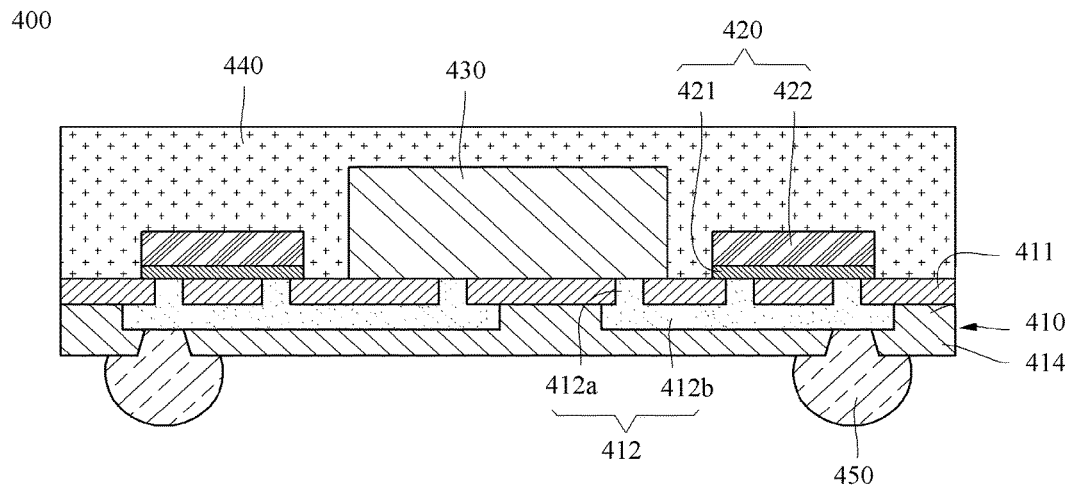
FIG. 4 shows a cross-sectional view of an example semiconductor device, in accordance with various aspects of the present disclosure.

FIG. 4 shows a cross-sectional view of an example semiconductor device 400, in accordance with various aspects of the present disclosure. The example device 400 may, for example, be manufactured by the example method 100 shown in FIG. 1 and discussed herein with regard to FIGS. 1-3.

Figure 5:
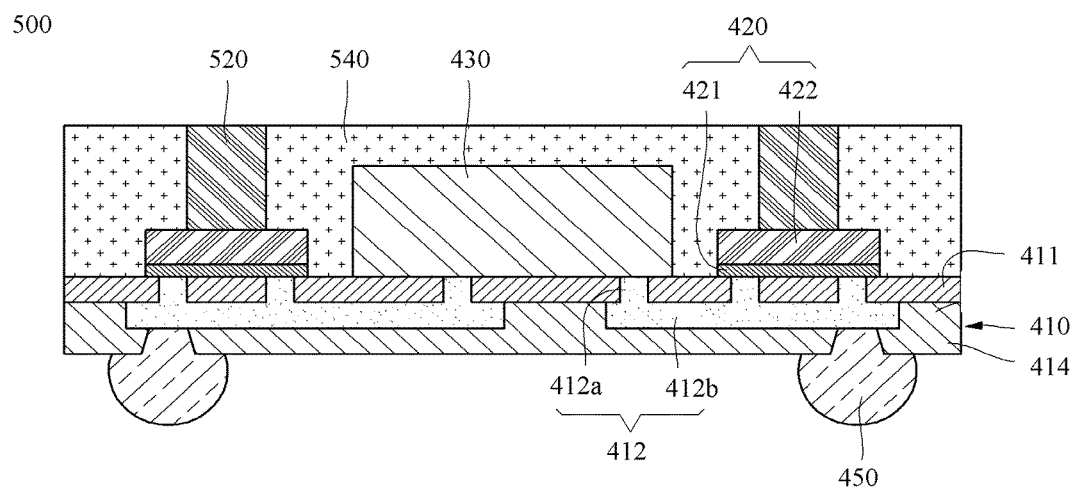
FIG. 5 shows a cross-sectional view of an example semiconductor device, in accordance with various aspects of the present disclosure.

In an example implementation, the semiconductor device may be formed to have one or more conductive columns that extend upward from the metal layer and comprise top ends that are exposed at the top side (or surface) of the encapsulating material. FIG. 5 shows an example of such an implementation. In particular, FIG. 5 shows a cross-sectional view of an example semiconductor device 500, in accordance with various aspects of the present disclosure. The example semiconductor device 500 may, for example, share any or all characteristics with any or all of the other semiconductor devices shown herein (e.g., semiconductor device 400, semiconductor device 600, semiconductor device 700, any portion(s) of such devices, etc.).

The example semiconductor device 500 comprises one or more conductive columns 520 that extend from a top side of the metal plane 420 to at least the top side or surface of the encapsulating material 440. The conductive column(s) 520 may be formed in any of a variety of manners, non-limiting examples of which are provided herein.

For example, with reference to the example method 100 of FIG. 1, the conductive column(s) 520 may be formed at blocks 110-130. For example, the conductive column(s) 520 may be formed after the forming of the metal plane 420. In an example implementation, the steps illustrated in FIGS. 2B and 2C may be repeated. In such a manner, the conductive column(s) 520 may be laterally narrower than corresponding portions of the metal plane 420 from which the column(s) 520 extend. Also for example, as shown in FIG. 5, the conductive column(s) 520 may be thicker in a vertical dimension than the corresponding portions of the metal plane 420 from which the column(s) 520 extend. Also for example, the top end (or surface) of the conductive column(s) 520 may be coplanar with a top surface of the encapsulating material 440 and/or with a top surface of the semiconductor die 430. For example, as explained with regard to block 150, the encapsulating material 440 may be originally formed having such a height, but the encapsulating material 440 may also be thinned (e.g., ground, etc.) to its final height. In such an implementation, the conductive column(s) 520 and/or the semiconductor die 430 may be similarly thinned (e.g., ground, etc.) to a same final height. In another example implementation, the conductive column(s) 520 may comprise wires that are wire-bonded (or otherwise attached) to the metal plane 420.

Additionally for example, with reference to the example method 100 of FIG. 1, the conductive column(s) 520 may be formed after the encapsulating material 440 has been formed. For example, via holes (e.g., through-mold vias (TMVs)) may be formed in the encapsulating material 440 between a top surface of the encapsulating material 440 and a top surface of the metal plane 420. Such via hole forming may, for example, be performed by laser ablation, mechanical ablation, etching, etc. Conductive material (e.g., solder paste, plated metal, etc.) may then be formed in the via hole(s) to provide a conductive path between the metal layer 440 and a top side (or surface) of the encapsulating material 440.

Note that in an example implementation in which, as shown by example in FIG. 3B, the metal plane 420 is divided into a plurality of electrically isolated sections, different conductive columns 520 may be electrically connected to different respective sections. For example, a first conductive column 520 may be connected (e.g., electrically, mechanically, etc.) to a first section of the metal plane 420 that is connected to a ground signal, a second conductive column 520 may be connected (e.g., electrically, mechanically, etc.) to a second section of the metal plane 420 that is connected to a non-ground voltage signal (e.g., a power supply signal), etc. In such a configuration, the ground signal and the non-ground voltage signal (and any other signal) may be provided at a top side of the device 500 to be provided to other devices, top-side signal distribution structures that may be formed on the device 500, etc.

Figure 6:
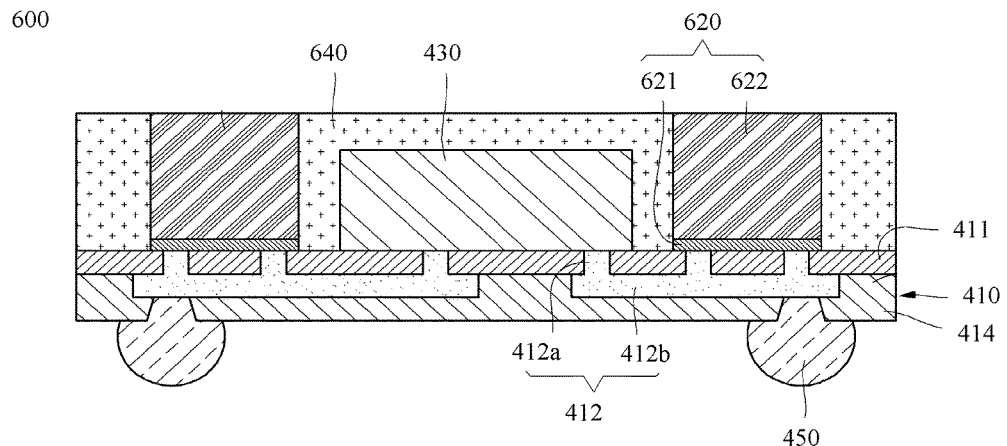
FIG. 6 shows a cross-sectional view of an example semiconductor device, in accordance with various aspects of the present disclosure.

In another example implementation, the plated metal 422 (e.g., as formed at block 120) may be formed having a vertical thickness that positions the upper end (or surface) of the plated metal 422 at the top of the semiconductor device. Such plated metal 422 (or conductive columns) may be formed to extend upward from the seed layer 421 (if present) and comprise top ends that are exposed at the top side (or surface) of the encapsulating material 440. FIG. 6 shows an example of such an implementation. In particular, FIG. 6 shows a cross-sectional view of an example semiconductor device 600, in accordance with various aspects of the present disclosure. The example semiconductor device 600 may, for example, share any or all characteristics with any or all of the other semiconductor devices shown herein (e.g., semiconductor device 400, semiconductor device 500, semiconductor device 700, any portion(s) of such devices, etc.).

The example semiconductor device 600, relative to the example semiconductor device 400 of FIG. 4, comprises a metal plane 620 (e.g., a seed layer 621 and/or plated metal layer 622) that extends vertically to at least the height of the semiconductor die 430 and/or to at least the height of the encapsulating material 440. In an example implementation, after the encapsulating at block 150, the encapsulating material 440 and/or the metal plane 620 and/or the semiconductor die 430 may be thinned or planarized (e.g., ground, etc.). In such an implementation, top surfaces of the metal plane 620 may be coplanar with a top surface of the encapsulating material 440 and/or with a top surface of the semiconductor die 430. The metal plane 620 may, for example, operate as the conductive columns 520 of FIG. 5, for example, providing electrical signals (e.g., ground signals, non-ground power supply signals, other signals, etc.) to a top side of the example semiconductor device 600.

Figure 7:
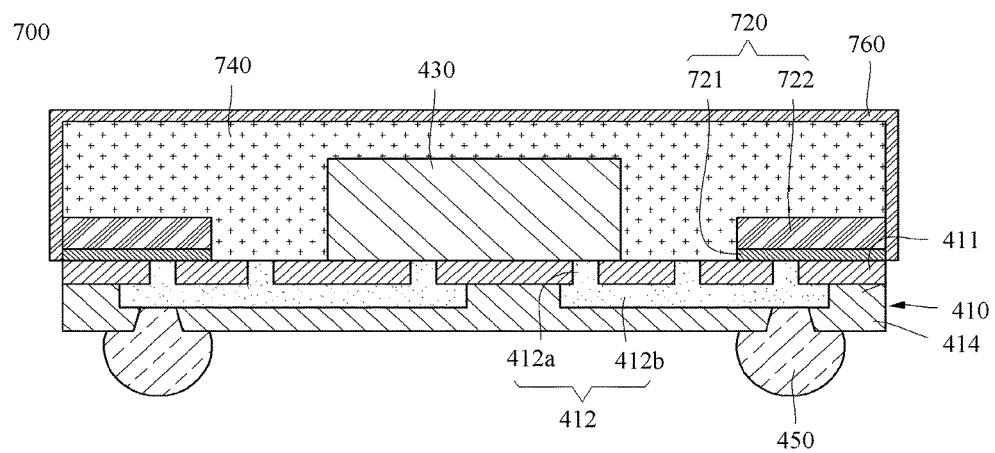
FIG. 7 shows a cross-sectional view of an example semiconductor device, in accordance with various aspects of the present disclosure.

In another example implementation, the metal layer may be exposed at a lateral side of the encapsulating material and/or of the semiconductor device. FIG. 7 shows an example of such an implementation. In particular, FIG. 7 shows a cross-sectional view of an example semiconductor device 700, in accordance with various aspects of the present disclosure. The example semiconductor device 700 may, for example, share any or all characteristics with any or all of the other semiconductor devices shown herein (e.g., semiconductor device 400, semiconductor device 500, semiconductor device 600, any portion(s) of such devices, etc.).

For example, in comparison to the example implementations 400, 500, and 600 shown in FIGS. 4-6, the example semiconductor device 700 of FIG. 7 shows the metal plane 720 (e.g., the seed layer 721, the plated metal layer 722, etc.) exposed at the lateral side of the encapsulating material 740.

The example semiconductor device 700 also comprises a metal shield 760 (e.g., an electromagnetic interference (EMI) shield, etc.). Note that the shield 760 may be made of materials other than metal (e.g., conductive plastic, conductive epoxy or paint, etc.). As discussed herein, block 195 of the example method 100 may comprise forming a shield (e.g., an electromagnetic shield, etc.).

The metal shield 760 may be formed in any of a variety of manners, non-limiting examples of which are provided herein. For example, the metal shield 760 may comprise a metal plate that has been shaped (e.g., stamped, bent, cast, etc.) into its final shape and then attached to the encapsulating material 740 and/or to the metal plane 720 (e.g., soldered, adhered, etc.). Also for example, the metal shield 760 may be formed by depositing a conformal coating on the encapsulating material 740 and/or metal plane 720.

Note that although the example metal shield 760 is shown covering only the lateral sides of the encapsulating material 740 and of the metal plane 720, the metal shield 760 may also cover the lateral sides of the substrate 410. Also note that instead of (or in addition to) the metal shield 760 being electrically connected to the metal plane 720 exposed at lateral sides of the encapsulating material 740, the metal shield 760 may be electrically connected to the metal plane 720 utilizing other conductive features discussed herein (e.g., the conductive column(s) 520 of FIG. 5, the top side of the metal plane 620 of FIG. 6, etc.).

While the semiconductor device and the fabricating method thereof according to various aspects of the present disclosure have been described with reference to certain supporting examples and/or implementations, it will be understood by those skilled in the art that the scope of the present disclosure is not be limited to the particular examples disclosed, but that the present disclosure will include all embodiments, examples, and implementations falling within the scope of the appended claims.

The discussion herein included numerous illustrative figures that showed various portions of an electronic device assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor device and a method of manufacturing a semiconductor device. As a non-limiting example, various aspects of this disclosure provide a semiconductor device comprising a semiconductor die coupled to a substrate and surrounded by a perforated metal plane and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
a substrate having a top substrate surface, a bottom substrate surface, and lateral substrate surfaces extending between the top and bottom substrate surfaces;
a metal plane on the top substrate surface, the metal plane comprising first and second apertures extending completely and vertically through the metal plane;
a semiconductor die on the top substrate surface and positioned within the first aperture of the metal plane, the semiconductor die having a top die surface, a bottom die surface, and lateral die side surfaces extending between the top and bottom die surfaces, wherein the bottom die surface is coupled to the top substrate surface; and
an encapsulating material that encapsulates at least a portion of the lateral die side surfaces and at least a portion of the top substrate surface, wherein the encapsulating material extends through the second aperture of the metal plane,
wherein:
the second aperture is entirely laterally bounded by the metal plane; and
the second aperture is free of electronic components.

2. The semiconductor device of claim 1, wherein the encapsulating material extends through the second aperture of the metal plane to the top substrate surface.

3. The semiconductor device of claim 2, wherein the encapsulating material completely fills the second aperture of the metal plane.

4. The semiconductor device of claim 1, wherein the encapsulating material extends into the first aperture of the metal plane.

5. The semiconductor device of claim 1, wherein no portion of the metal plane is directly below the semiconductor die.

6. The semiconductor device of claim 1, wherein no portion of the metal plane is lower than the semiconductor die.

7. The semiconductor device of claim 1, wherein the metal plane comprises a top metal plane surface that is at least as high as the top die surface.

8. The semiconductor device of claim 1, comprising a conductive column that extends upward from the metal plane and comprises a top column surface that is at least as high as the top die surface, wherein the encapsulating material directly contacts and entirely laterally surrounds the conductive column.

9. The semiconductor device of claim 1, wherein a lateral surface of the metal plane is exposed from the encapsulating material, and further comprising a conductive shield coupled to the lateral surface of the metal plane.

10. The semiconductor device of claim 1, wherein the encapsulating material completely laterally surrounds the metal plane.

11. The semiconductor device of claim 1, wherein the metal plane comprises a plurality of additional apertures that extend completely through the metal plane and are entirely filled with the encapsulating material, wherein each of the plurality of additional apertures is entirely laterally bounded by the metal plane.

12. A semiconductor device comprising:
a substrate having a top substrate surface, a bottom substrate surface, and lateral substrate surfaces extending between the top and bottom substrate surfaces;
a metal layer on the top substrate surface, the metal layer comprising a first section comprising first and second apertures extending completely through the first section, and a second section electrically isolated from the first section and comprising a third aperture extending completely through the second section;
a semiconductor die on the top substrate surface and positioned within the first aperture of the first section, the semiconductor die having a top die surface, a bottom die surface, and lateral die side surfaces extending between the top and bottom die surfaces, wherein the bottom die surface is coupled to the top substrate surface; and
an encapsulating material that encapsulates at least a portion of the lateral die side surfaces and at least a portion of the top substrate surface, wherein the encapsulating material fills the second aperture of the first section and the third aperture of the second section.

13. The semiconductor device of claim 12, wherein the metal layer covers at least half of the substrate.

14. The semiconductor device of claim 12, wherein the first section and second section of the metal layer laterally surround the semiconductor die.

15. The semiconductor device of claim 12, wherein the first section is configured to be electrically coupled to a first power supply signal, and the second section is configured to be electrically coupled to a second power supply signal different from the first power supply signal.

16. The semiconductor device of claim 15, wherein the first power supply signal comprises a ground signal, and the second power supply signal comprises a non-ground signal power supply signal.

17. A semiconductor device comprising:
a substrate having a top substrate surface, a bottom substrate surface, and lateral substrate surfaces extending between the top and bottom substrate surfaces;
a metal layer on the top substrate surface, the metal layer comprising first and second apertures extending completely and vertically through the metal layer;
a semiconductor die on the top substrate surface and positioned within the first aperture of the metal layer, the semiconductor die having a top die surface, a bottom die surface, and lateral die side surfaces extending between the top and bottom die surfaces, wherein the bottom die surface is coupled to the top substrate surface; and
an encapsulating material that encapsulates at least a portion of the lateral die side surfaces and at least a portion of the top substrate surface, wherein the encapsulating material extends into the second aperture of the metal layer,
wherein:
a metal surface exposed at a top surface of the encapsulating material is electrically connected to the metal layer;
the second aperture is entirely laterally bounded by the metal layer; and
the second aperture is free of electronic components.

18. The semiconductor device of claim 17, wherein the exposed metal surface is a top surface of the metal layer.

19. The semiconductor device of claim 17, wherein the exposed metal surface is a top surface of a conductive column that is attached to the metal layer, and the encapsulating material directly contacts and entirely laterally surrounds the conductive column.

20. The semiconductor device of claim 17, comprising a second metal surface exposed at the top surface of the encapsulating material and electrically connected to the metal layer, and wherein:
- the metal surface is electrically connected to a first section of the metal layer and a first power supply signal; and
- the second metal surface is electrically connected to a second section of the metal layer and a second power supply signal.

* * * * *